United States Patent
Tsao et al.

(10) Patent No.: US 7,719,122 B2
(45) Date of Patent: May 18, 2010

(54) SYSTEM-IN-PACKAGE PACKAGING FOR MINIMIZING BOND WIRE CONTAMINATION AND YIELD LOSS

(75) Inventors: Pei-Haw Tsao, Taichung (TW); Bill Kiang, Hsinchu (TW); Liang-Chen Lin, Hsinchu (TW); Pao-Kang Niu, Hsinchu (TW); I-Tai Liu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 555 days.

(21) Appl. No.: 11/652,086

(22) Filed: Jan. 11, 2007

(65) Prior Publication Data
US 2008/0169557 A1 Jul. 17, 2008

(51) Int. Cl.
*H01L 23/48* (2006.01)
*H01L 23/52* (2006.01)

(52) U.S. Cl. ............... 257/784; 257/777; 257/778; 257/E23.024

(58) Field of Classification Search ................. 257/777, 257/784, 778, 787, E23.024
See application file for complete search history.

(56) References Cited

U.S. PATENT DOCUMENTS

| | | | |
|---|---|---|---|
| 6,100,594 A * | 8/2000 | Fukui et al. | 257/777 |
| 6,376,921 B1 * | 4/2002 | Yoneda et al. | 257/787 |
| 6,420,787 B1 * | 7/2002 | Kobayashi et al. | 257/777 |
| 6,780,749 B2 * | 8/2004 | Masumoto et al. | 438/612 |
| 7,215,031 B2 * | 5/2007 | Egawa | 257/773 |
| 7,271,496 B2 * | 9/2007 | Kim | 257/778 |
| 2002/0050653 A1 * | 5/2002 | Masumoto et al. | 257/784 |
| 2004/0061220 A1 * | 4/2004 | Miyazaki et al. | 257/723 |
| 2005/0006785 A1 * | 1/2005 | Liu et al. | 257/777 |
| 2005/0045378 A1 * | 3/2005 | Heng et al. | 174/260 |

FOREIGN PATENT DOCUMENTS

CN  1551351 A  12/2004

* cited by examiner

*Primary Examiner*—Nitin Parekh
(74) *Attorney, Agent, or Firm*—Birch Stewart Kolasch & Birch, LLP

(57) ABSTRACT

A system-in-package (SiP) package is provided. In one embodiment, the SiP package comprises a substrate having a first surface and a second surface opposite the first surface, the substrate having a set of bond wire studs on bond pads formed on the second surface thereof; a first semiconductor chip having a first surface and a second surface opposite the first surface, wherein the first surface of the first semiconductor chip is mounted to the second surface of the substrate by means of solder bumps; an underfill material disposed between the first semiconductor chip and the substrate, encapsulating the solder bumps; a second semiconductor chip having a first surface and a second surface opposite the first surface, wherein the first surface of the second semiconductor chip is mounted to the second surface of the first semiconductor chip; and a set of bond wires electrically coupled from the second semiconductor chip to the set of bond wire studs on the substrate.

6 Claims, 3 Drawing Sheets

SYSTEM-IN-PACKAGE PACKAGING FOR MINIMIZING BOND WIRE CONTAMINATION AND YIELD LOSS

BACKGROUND

The present invention relates generally to integrated circuit packaging and, more particularly, to system-in-package (SiP) packaging for minimizing bond wire contamination and yield loss.

As portable electronic devices become smaller, the dimensions of semiconductor packages in the electronic devices must also be reduced. To help accomplish this, system-in-package technology is widely used because it can increase the capacity of the semiconductor package. SiP packages include a plurality of chips, which are stacked and may be connected to each other by way of solder bumps and/or wire bonding.

FIG. 1. is a cross-sectional view of a conventional flip chip-based SiP package having bond wires. Package 10 comprises a substrate 20 having first and second surfaces 30 and 40, respectively. A plurality of solder balls 110 are disposed on the first surface 30. A plurality of solder bumps 60 electrically connect the second surface 40 of the substrate 20 to an active surface of a large chip 50, such as for example a digital device. A small chip 80, such as an analog device, is stacked on a back surface of the large chip 50. Bond wires 90 electrically couple the small chip 80 to bond pads 95 on substrate 20.

To provide mechanical reinforcement to the large chip 50 and the substrate 20, an underfill material 70, such as resin, is typically dispensed in the gap between the large chip 50 and the substrate 20. This gap, if not underfilled, would easily cause the package 10 to suffer from fatigue cracking and electrical failure when it is being subjected to high-temperature conditions. One drawback to conventional underfill processes, however is that prior to the wire bonding process, the dispensed resin would easily flow wayward to nearby bond pads, contaminating them and making proper wire bonding of bond wires 90 to bond pads 95 difficult, if not impossible, resulting in yield loss. For this reason, chip package designers typically specify that a minimum distance A between an edge of the large chip 50 and the bond pad 95 of the substrate be more than 0.3 mm to avoid the underfill material overflowing the bond pads. However, due to this design rule constraint, designers are often not afforded design flexibility, which exacerbates the situation because they are precluded from manufacturing packages having reduced dimensions.

FIG. 1 shows a cross-sectional view of a SiP package where the underfill material 70 does not overflow on a bond pad 95. FIGS. 2A and 2B show examples of SiP packages depicting the overflow problem 120. FIG. 2A shows underfill material 70 overflowing a bond pad 95 in a flip chip-based SiP package; whereas FIG. 2B shows an adhesive material 75 overflowing a bond pad 95 in a wire bond SiP package.

For these reasons and other reasons that will become apparent upon reading the following detailed description, there is a need for an improved SiP package for minimizing bond wire contamination and yield loss and a method thereof that avoids the reliability concerns associate with conventional SiP packages.

SUMMARY

The present invention is directed to a system-in-package (SiP) package. In one embodiment, the SiP package comprises a substrate having a first surface and a second surface opposite the first surface, the substrate having a set of bond wire studs on bond pads formed on the second surface thereof, a first semiconductor chip having a first surface and a second surface opposite the first surface, wherein the first surface of the first semiconductor chip is mounted to the second surface of the substrate by means of solder bumps; an underfill material disposed between the first semiconductor chip and the substrate, encapsulating the solder bumps; a second semiconductor chip having a first surface and a second surface opposite the first surface, wherein the first surface of the second semiconductor chip is mounted to the second surface of the first semiconductor chip; and a set of bond wires electrically coupled from the second semiconductor chip to the set of bond wire studs on the substrate.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough-understanding of the present invention. However, one having an ordinary skill in the art will recognize that the invention can be practiced without these specific details. In some instances, well-known structures and processes have not been described in detail to avoid unnecessarily obscuring the present invention.

Reference will now be made in detail to the present preferred embodiments of the present invention, examples of which are illustrated in the accompanying drawings.

Figure 1:
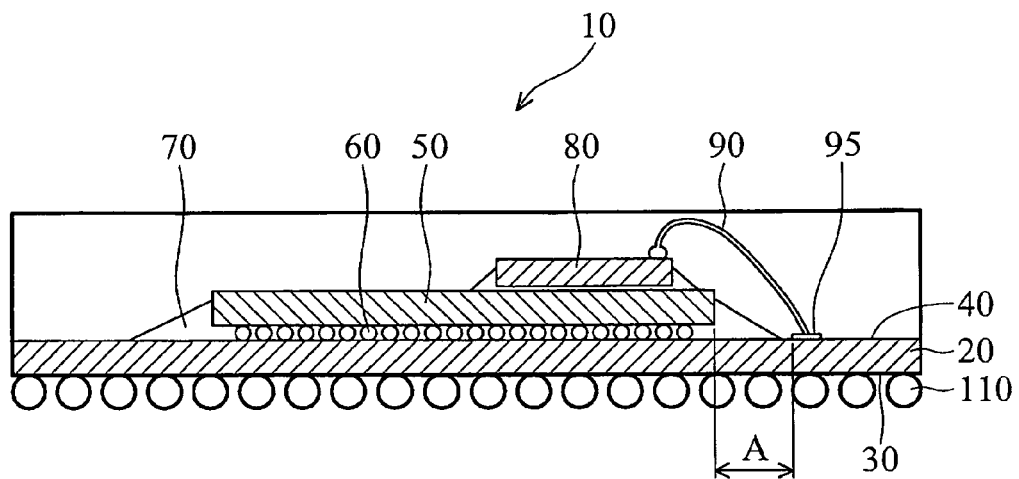
FIG. 1 is a cross-sectional view of a conventional SiP package.
Figure 2A:
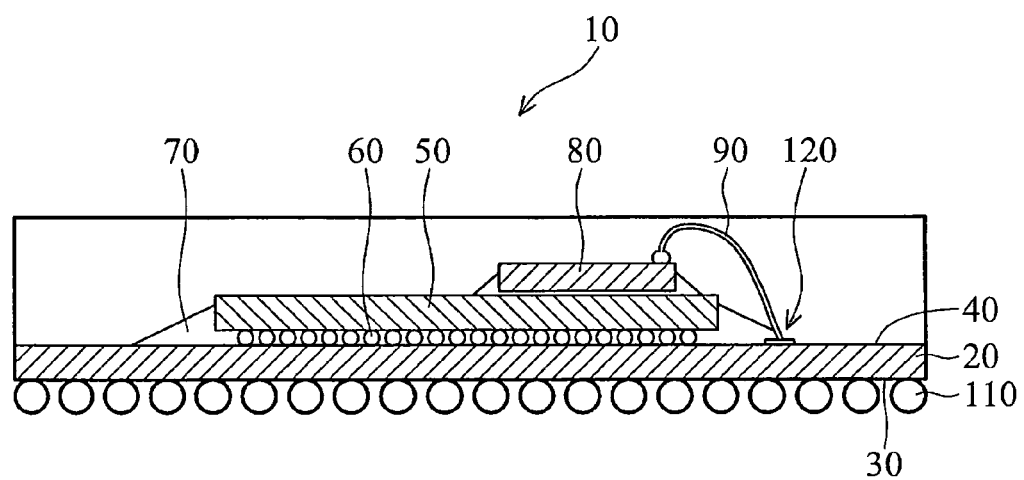
FIGS. 2A-2B are cross-sectional views of conventional SiP packages used to depict a drawback of conventional wire bonding processes.
Figure 2B:
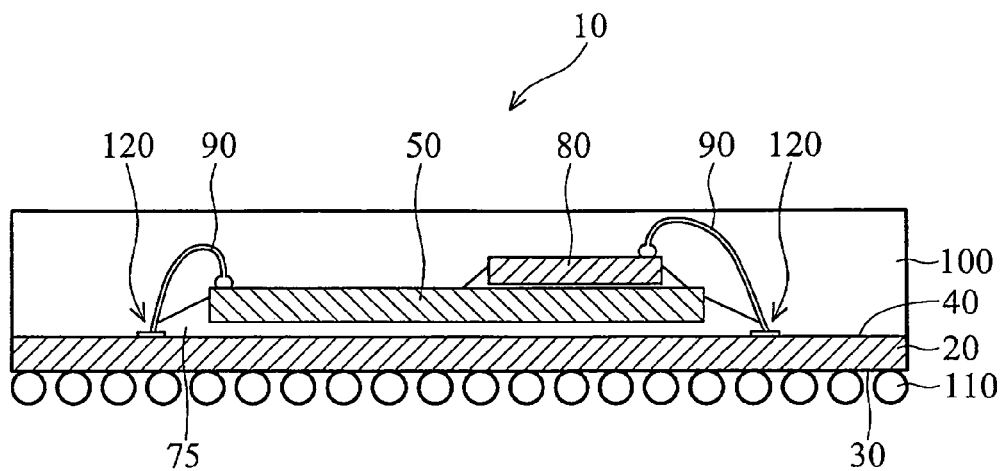
Figure 3:
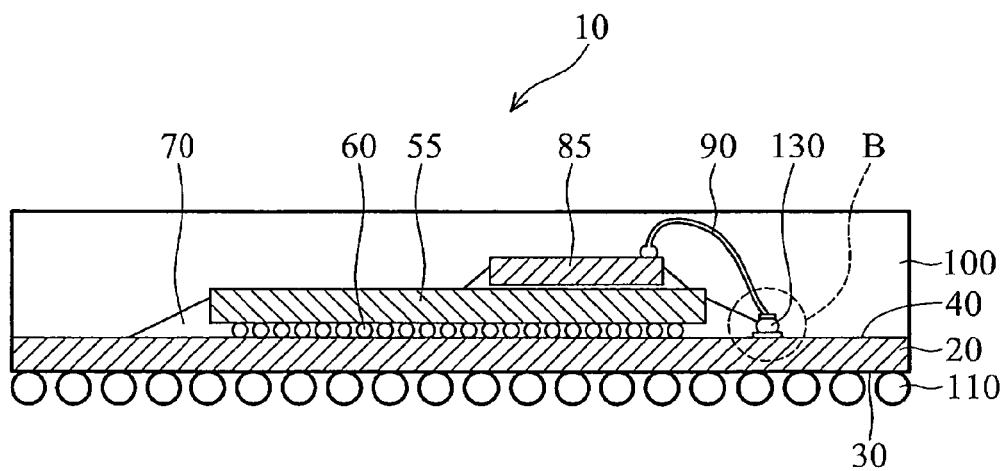
FIG. 3 is a cross-sectional view of a SiP package according to one embodiment of the present invention.
Figure 4:
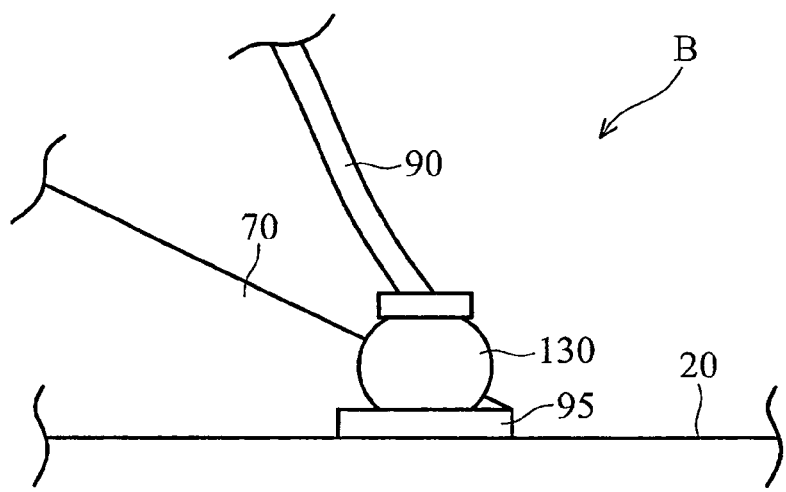
FIG. 4 is a detailed view of a bond wire stud employed in a SiP package according to one embodiment of the present invention.

FIG. 3 is a cross-sectional view of a SiP package according to one embodiment of the present invention. Package 10 comprises a substrate 20 having first and second surfaces 30 and 40, respectively. Substrate 20 can be a leadframe, PCB, or other well-known package substrates. A plurality of solder balls 1 10 may be disposed on the first surface 30 of the substrate 20 for coupling to another substrate (not shown). Substrate 20 has a set of bond wire studs 130 formed on the second surface thereof. Bond wire studs 130 may be formed on substrate 20 by conventional wire bonding and/or bump processes and may comprise of gold, copper, aluminum, alloys of the afore-mentioned metals, or other conductive metals as is known in the art. It is understood that bond wire studs 130 are formed on bond pads (sometimes also referred to as wire-bonding fingers) of substrate 20 before mounting a chip over the substrate. In this way, even if an underfill material or adhesive such as epoxy overflow onto the bond pad, so long as the top surface of the bond wire stud is exposed and there is enough wire bonding area thereon, a wire can be properly wire-bonded to a bond wire stud 130. The dimensions of the bond wire stud 130 will of course depend on design requirements; however, in one embodiment of the present invention, bond wire studs 130 have a height of between about 10 μm to about 30 μm high. In another embodiment, a space between an edge of the first semiconductor chip 55 and one of the set of bond wire studs 130 can be as small as 0.1 mm to about 0.2 mm. A detailed view B of a bond wire stud employed in a SiP package according to one embodiment of the present invention is shown in FIG. 4.

After formation of the set of bond wire studs 130 on the second surface 40 of substrate 20, the first semiconductor chip 55 is mounted in a flip-chip manner over the substrate 20 to reduce the package profile. The first semiconductor chip 55 has a first surface and a second surface opposite the first surface, wherein the first surface of the first semiconductor chip 55 is mounted to the second surface 40 of substrate 20 by means of a plurality of solder bumps 60. Solder bumps 60 can be solder, gold, copper, conductive organic materials, or other conductive materials as is known in the art. In other embodiments, wire-bonding (such as that shown in FIG. 5), tape-automatic bonding (TAB), or other known package technologies may be utilized to electrically connect the first semiconductor chip 55 to substrate 20.

Thereafter, an underfill material 70 is disposed between the first semiconductor chip 55 and the substrate 20 to encapsulate the solder bumps and enhance the structural rigidity and reliability of the package to buffer against thermal stresses induced by environmental factors such as thermal cycles. A predetermined amount of underfill material 70, such as resin, is directly dispensed in the gap between first semiconductor chip 55 and substrate 20. The dispensed resin will then fill into the gap through capillary action. It is understood that the resin may come in contact with the set of bond wire studs 130 but they do not flow over and/or overlap the top surfaces of the set of bond wire studs 130.

Following dispensation of the underfill material, a second semiconductor chip 85 is stacked on a back surface of the first semiconductor chip 55 by means of an adhesive, such as epoxy. By conventional wire bonding processes, a set of bond wires 90 electrically couple the second semiconductor chip 85 to the set of bond wire studs 130 on substrate 20. Thereafter, an encapsulant 100 such as a mixture of thermosetting epoxy, silica fillers, polyimide adhesive, or other materials as is known in the art encapsulates the first and second semiconductor chips, the set of bond wires, and the set of bond wire studs to prevent potential damage from moisture or other environmental contaminants.

Figure 5:
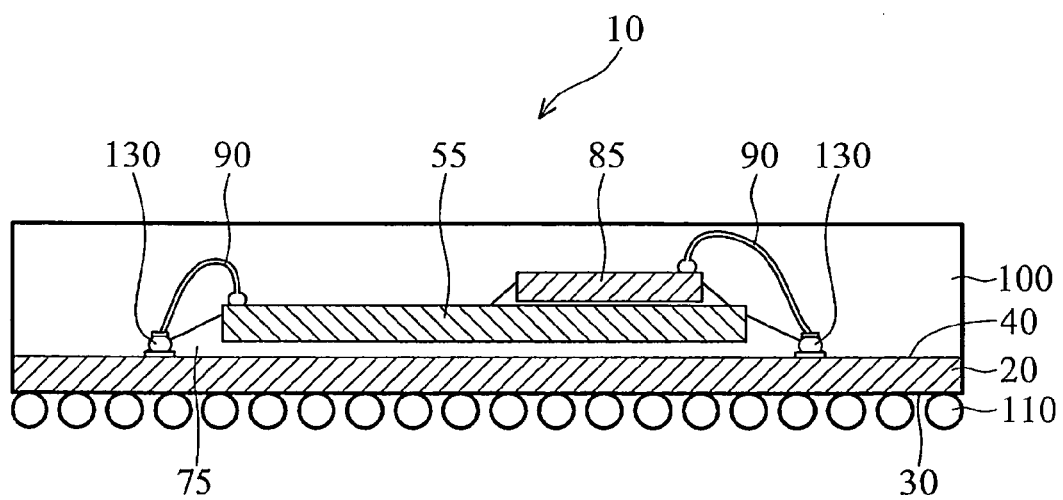
FIG. 5 is a cross-sectional view of a SiP package according to another embodiment of the present invention.

In an alternative embodiment, as shown in FIG. 5, first semiconductor chip 55 is mounted onto substrate 20 by means of an adhesive 75, such as epoxy and another set of bond wires electrically connect the first semiconductor chip to the substrate by way of another set of bond wire studs.

The SiP package according to aspects of the present invention offers several advantages to the chip designer. First, the problem of yield loss caused by contamination and improper wire-bonding when the underfill or adhesive overflow to nearby bond pads is solved by the use of bond wire studs. Second, designers are given greater flexibility in chip designs because they are no longer constrained to design packages where the minimum distance between an edge of a large chip mounted on a substrate and a bond pad must be more than 0.3 mm. Accordingly, they are free to design packages having reduced dimensions.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A semiconductor package, comprising:
   a substrate having a first surface and a second surface opposite the first surface, the substrate having a set of bond wire studs on first bond pads formed on the second surface thereof;
   a first semiconductor chip having a first surface and a second surface opposite the first surface, wherein the first surface of the first semiconductor chip is mounted to the second surface of the substrate by means of solder bumps;
   an underfill material disposed between the first semiconductor chip and the substrate, encapsulating the solder bumps;
   a second semiconductor chip having a first surface and a second surface opposite the first surface, wherein the first surface of the second semiconductor chip is mounted to the second surface of the first semiconductor chip; and
   a set of bond wires electrically coupled from the second semiconductor chip to the set of bond wire studs on the substrate through second bond pads between the bond wire and the wire studs.

2. The semiconductor package of claim 1, wherein the underfill material fills into the gap between the first semiconductor chip and the substrate through capillary action, and further wherein the underfill material does not flow over and/or overlap the top surfaces of the set of bond wire studs.

3. The semiconductor package of claim 1, wherein the first surface of the second semiconductor chip is mounted to the second surface of the first semiconductor chip by means of an adhesive.

4. The semiconductor package of claim 1, wherein a space between an edge of the first semiconductor chip and one of the set of bond wire studs of the substrate is about 0.1 mm to about 0.2 mm.

5. The semiconductor package of claim 1, wherein a height of one of the set of bond wire studs is between about 10 μm to about 30 μm high.

6. The semiconductor package of claim 1, further comprising an encapsulant that encapsulates the first and second semiconductor chips, the set of bond wires, and the set of bond wire studs.

* * * * *